United States Patent [19]

Petitpierre

[11] Patent Number: 5,491,613
[45] Date of Patent: Feb. 13, 1996

[54] ELECTRICAL CIRCUIT CARD WITH REDUCED EMI EMISSION

[75] Inventor: Eric M. Petitpierre, Westminster, Md.

[73] Assignee: Hubbell Incorporated, Orange, Conn.

[21] Appl. No.: 189,900

[22] Filed: Jan. 31, 1994

[51] Int. Cl.$^6$ .............................. H05K 7/14; H05K 9/00
[52] U.S. Cl. ..................... 361/800; 174/35 R; 361/799; 361/818
[58] Field of Search ............................ 174/35 R, 35 GC, 174/35 TS, 51; 206/275; 211/41; 220/402; 307/91, 100; 361/212, 220, 221, 222, 730, 736, 752, 753, 756, 797, 799, 800, 816, 818; 439/61, 62, 92, 93, 95, 101, 102, 103, 609, 607

[56] References Cited

U.S. PATENT DOCUMENTS

| | | | |
|---|---|---|---|
| 3,276,560 | 10/1966 | Wirtz | 197/18 |
| 3,469,015 | 9/1969 | Warren | 174/35 R |
| 3,573,558 | 4/1971 | Babcock | 317/101 |
| 3,860,318 | 1/1975 | Reavis, Jr. et al. | 439/61 |
| 3,904,810 | 9/1975 | Kraus | 174/35 R |
| 4,070,557 | 1/1978 | Ostapovitch | 200/51.1 |
| 4,203,148 | 5/1980 | McComas | 361/752 |

(List continued on next page.)

FOREIGN PATENT DOCUMENTS

| | | | |
|---|---|---|---|
| 0090539 | 10/1983 | European Pat. Off. . | |
| 2571922 | 10/1984 | France . | |
| 2844576 | 4/1980 | Germany . | |
| 3211758 | 10/1983 | Germany . | |
| 3228393 | 2/1984 | Germany . | |
| 195568 | 4/1989 | Japan . | |
| 2100398 | 4/1990 | Japan . | |
| 3-270097 | 12/1991 | Japan | 361/796 |
| 4-15996 | 1/1992 | Japan | 361/800 |
| 494191 | 3/1992 | Japan . | |
| 555781 | 3/1993 | Japan . | |
| 2196798 | 5/1988 | United Kingdom . | |
| 2208970 | 4/1989 | United Kingdom . | |

OTHER PUBLICATIONS

M. Hodgetts, "A Shielded Computer Interface Connector", *Fifteenth Annual Connectors and Interconnection Technology Symposium Proceedings*, pp. 113–118 (Nov. 1982).
J. Landis, "Approaches to EMI Control in Digital Data Transmission Systems", Fifteenth Annual Connectors and Interconnection Technology Symposium Proceedings, pp. 355–364 (Nov. 1982).
D. Eaby, "Developing a Metal Shell Circular Plastic Connector", Fifteenth Annual Connectors and Interconnection Technology Symposium Proceedings, pp. 365–374 (Nov. 1982).
*Guide to Interference Control Using Beryllium Cooper*, Instrument Specialties Co., Inc., Catalog E$^3$–78 (1987).
"EMI/ESD Depletion Strip", *IBM Technical Disclosure Bulletin* vol. 32, No. 3B, pp. 126–127 (Aug. 1989).
Sears and Zemansky, *University Physics*, Fourth Edition, pp. 392–393.
N.Y. Telephone Scheme.

*Primary Examiner*—Donald A. Sparks
*Attorney, Agent, or Firm*—Jerry M. Presson; John E. Holmes

[57] ABSTRACT

An electrical circuit card adapted to be removably received in a grounded, electrically conductive housing comprises an insulative circuit board, an insulative faceplate coupled to the circuit board along the front edge thereof, and an electrically conductive shielding strip behind the faceplate for reducing EMI emission. The shielding strip comprises an intermediate portion extending generally vertically along the rear surface of the faceplate, resilient upper and lower spring arms extending rearwardly at an angle from the intermediate portion, and upper and lower contact pads at the ends of the respective upper and lower spring arms. The upper and lower contact pads form planar contact areas which are disposed at an angle relative to the spring arms, and which are parallel to corresponding electrical contact surfaces provided on the housing. The planar contact areas of the shielding strip form reliable electrical connections with the housing upon insertion of the circuit card, and also provide capacitive coupling between the shielding strip and the housing in the event that direct contact is not established.

20 Claims, 6 Drawing Sheets

U.S. PATENT DOCUMENTS

| | | | |
|---|---|---|---|
| 4,301,494 | 11/1981 | Jordan | 361/796 |
| 4,384,165 | 5/1983 | Loving, Jr. et al. | 174/35 R |
| 4,386,388 | 5/1983 | Beun | 361/752 |
| 4,525,802 | 6/1985 | Hackamack | 364/900 |
| 4,567,317 | 1/1986 | Ehrlich et al. | 174/35 |
| 4,631,641 | 12/1986 | Brombal et al. | 361/818 |
| 4,683,550 | 7/1987 | Jindrick et al. | 364/900 |
| 4,694,380 | 9/1987 | Mallory et al. | 361/818 |
| 4,713,633 | 12/1987 | Saito et al. | 333/222 |
| 4,744,006 | 5/1988 | Duffield | 361/785 |
| 4,758,928 | 7/1988 | Wierce et al. | 361/796 |
| 4,762,966 | 8/1988 | Kosanda | 174/35 R |
| 4,780,570 | 10/1988 | Chuck | 174/35 R |
| 4,791,524 | 12/1988 | Teigen et al. | 361/212 |
| 4,821,145 | 4/1989 | Corfits et al. | 361/818 |
| 4,829,432 | 5/1989 | Hershberger et al. | 361/818 |
| 4,851,609 | 7/1989 | Reddy | 174/35 R |
| 4,872,212 | 10/1989 | Roos et al. | 361/818 |
| 4,903,170 | 2/1990 | Finney et al. | 361/818 |
| 4,970,625 | 11/1990 | Belanger et al. | 361/818 |
| 4,991,062 | 2/1991 | Nguyenngoc | 361/818 |
| 5,084,802 | 1/1992 | Nguyenngoc | 361/818 |
| 5,335,147 | 8/1994 | Weber | 361/818 |

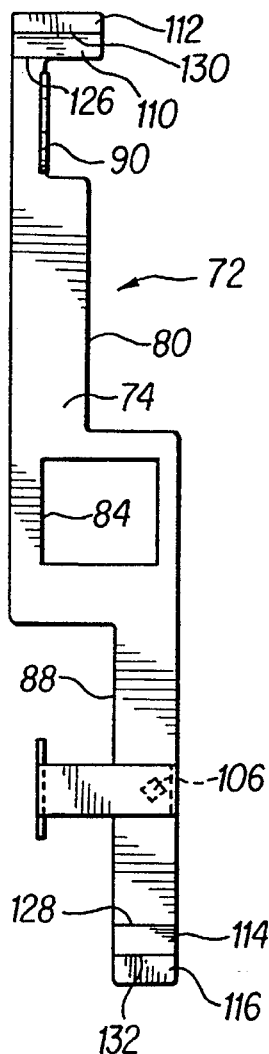
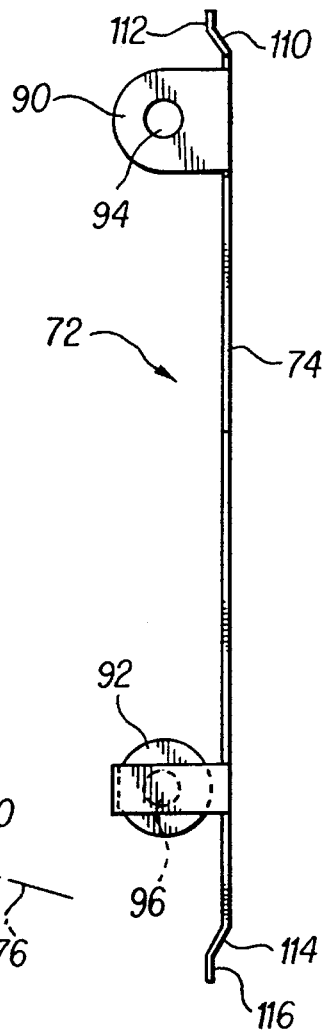
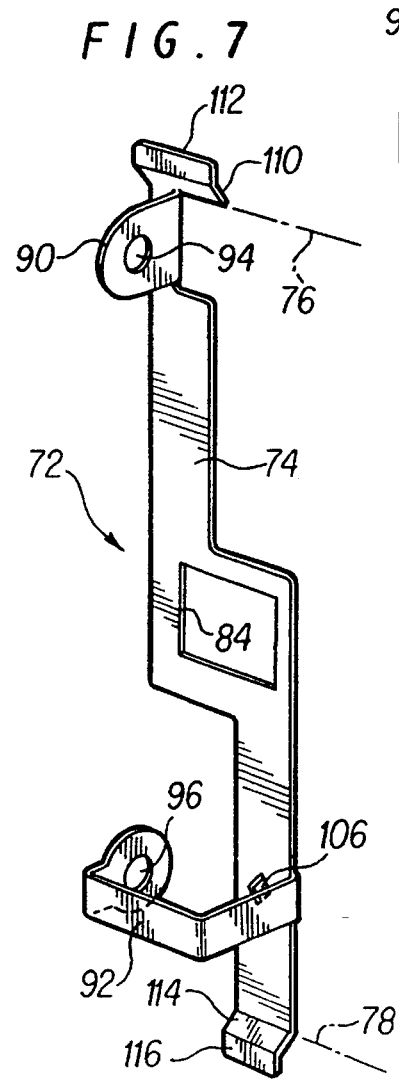
FIG. 5
FIG. 6
FIG. 7

5,491,613

ELECTRICAL CIRCUIT CARD WITH REDUCED EMI EMISSION

CROSS-REFERENCE TO RELATED APPLICATIONS

Related subject matter is disclosed and claimed in U.S. patent application Ser. No. 08/068,801, filed by Wilfred L. Gleadall on Nov. 12, 1992 now abandoned and entitled "CIRCUIT CARD ASSEMBLY WITH SHIELDING ASSEMBLY FOR REDUCING EMI EMISSIONS" which is a continuation of prior application Ser. No. 07/751,192, filed on Aug. 29, 1991 and now abandoned, the disclosures of these prior applications being expressly incorporated herein by reference.

FIELD OF THE INVENTION

The present invention relates to electrical circuit card assemblies in which the emission of electromagnetic interference (EMI) into the surrounding environment is reduced. More specifically, the invention relates to an electrical circuit card assembly in which an electrically conductive shielding strip located behind the faceplate of the card assembly makes contact with the conductive frame or housing into which the card assembly is inserted, in order to reduce EMI emissions that would otherwise occur through the housing.

BACKGROUND OF THE INVENTION

Many types of analog and digital electrical equipment produce stray electromagnetic radiation, referred to as electromagnetic interference (EMI), which is emitted into the surrounding environment, The EMI usually results from analog circuit: components which oscillate at high frequencies, or from digital components which operate at high clocking or switching rates. These emissions are undesirable since they can, if sufficiently strong, interfere with the operation of radio receivers and other nearby electrical equipment. Regulations have been established for the maximum permissible EMI emissions from various types of electrical equipment, and these regulations must be taken into account when designing new equipment in which EMI might be a problem.

For some types of electronic equipment., such as telephone channel banks used to carry out analog-to-digital and digital-to-analog conversion between subscriber lines and telephone company lines, EMI reduction is difficult because of the basic design of the equipment and the practical need to allow access to the equipment by service personnel. Typically, telephone channel banks consist of rows of pull-out circuit cards, referred to as channel units, which are contained in a metal frame or housing. The housing is grounded and provides effective EMI shielding at the top, bottom, sides and back of the channel banks, but there is little shielding at the front since the frame must be left open to allow for the removal and replacement of the individual channel units. In essence, the rectangular front opening of each row or shelf in the housing serves as a slot or waveguide antenna for the electromagnetic radiation. Even though these openings are physically closed off by the channel unit faceplates when all of the channel units are fully inserted, they are electrically open since the channel unit faceplates are typically made of plastic and are essentially transparent to electromagnetic radiation.

Two approaches have been developed for reducing EMI emissions in telephone channel banks. In one approach, exemplified by U.S. Pat. Nos. 4,991,062 and 5,084,802, both to Nguyenngoc, a resilient metal strip is fastened to the back of the channel unit faceplate and is bent outwardly near its upper and lower ends to form spring contacts which extend rearwardly at an angle from the plane of the faceplate. When the channel unit is inserted into the grounded channel bank housing, the spring contacts are brought into contact with conductive areas of the housing located immediately above and below the channel bank shelf opening, thereby creating an electroconductive shunt across the shelf opening and reducing its effectiveness as a slot antenna. Although this arrangement is effective in theory, there is a practical disadvantage in that the spring contacts must essentially be flattened against the back surface of the faceplate during insertion of the channel unit in order to insure full contact with the conductive surfaces of the housing. If this does not occur, either because of poor manufacturing tolerances or because the channel unit has not been fully inserted, the spring contacts will touch the housing over a much smaller area. This can increase the impedance of the shunt (particularly if dirt or other contaminants are present) and reduce its ability to suppress EMI emissions. The degree of bending required to flatten the spring contacts can also deform the spring contacts over time, reducing their resiliency.

In the aforementioned copending U.S. patent application of Wilfred L. Gleadall, which is assigned to the assignee of the present invention, a different approach is taken. Rather than providing spring contacts at the top and bottom of the conductive strip for connecting both ends of the strip to the frame or housing, a spring contact is provided only at the top of the conductive strip. However, the conductive strip is also connected to ground by means of a printed ground wire on the channel unit circuit board itself, thereby allowing a separate ground connection to be made through the edge connector at the rear of the channel unit card. In this way, the conductive strip is reliably connected to ground without depending entirely on the quality of the electrical contact between the spring contact and the conductive surface of the housing. However, EMI suppression is affected to some extent by the lack of a direct shunt across the channel bank opening itself, and the need for a printed ground wire on the channel unit circuit board may be undesirable in some instances.

SUMMARY OF THE INVENTION

The primary object of the present invention is to provide an electrical circuit card assembly in which EMI reduction is realized through the use of a conductive strip or shunt, while at the same time avoiding the disadvantages and limitations of the prior art.

A further object of the invention is to provide an electrical circuit card assembly in which the conductive strip or shunt employs flat planar contact areas to assure a low-impedance connection between the conductive strip and the adjoining conductive areas of the frame or housing in which the circuit card assembly is received.

A further object of the invention is to provide an electrical circuit card assembly in which a conductive strip of relatively simple and inexpensive construction is used for EMI reduction, and in which precise manufacturing tolerances are not required to assure proper contact between the conductive strip and the adjoining areas of the frame or housing in which the circuit card assembly is received.

Still another object of the invention is to provide an electrical circuit card assembly in which capacitive coupling is provided between an EMI-reducing shielding strip and the adjoining areas of the frame or housing, so that the shunting action of the shielding strip is still effective in the presence of dirt and other contaminants.

The foregoing objects are substantially achieved by providing an electrical circuit card assembly employing an electrically conductive shielding strip of improved configuration for reducing the emission of electromagnetic interference when the circuit card assembly is received in a grounded, electrically conductive housing. The circuit card assembly is of the type comprising an insulative circuit board and an insulative faceplate coupled to the circuit board along one edge thereof, such that a rear surface of the faceplate faces the circuit board. The improved shielding strip comprises an intermediate portion adapted to extend generally vertically along the rear surface of the faceplate, resilient upper and lower spring arms each extending rearwardly from the intermediate portion at an angle relative to the intermediate portion, and upper and lower contact pads at the ends of the respective upper and lower spring arms. In contrast to the spring contacts of the prior art, the upper and lower contact pads of the present invention form planar contact areas which are each disposed at an angle relative to the respective upper and lower spring arms, and are oriented vertically so that they are parallel to the corresponding electrical contact areas of the housing in which the card assembly is inserted. The planar contact areas of the contact pads allow low impedance connections to be formed between the ends of the conductive shielding strip and the conductive contact areas of the housing, without requiring that the spring arms themselves be flattened against the contact areas of the housing. As a result, reliable and effective connections can be made without requiring precise manufacturing tolerances for the circuit card assembly or housing, and without requiring that the circuit card assembly be fully inserted into the housing.

The present invention is directed to an electrically conductive shielding strip having the improved configuration described above, to an electrical circuit card incorporating such a shielding strip, and to an electrical assembly comprising a housing and an electrical circuit card incorporating an electrical shielding strip of the type described. The present invention is also directed to a method for reducing the emission of electromagnetic interference from an electrical circuit card through the use of a conductive shielding strip with a planar contact area.

BRIEF DESCRIPTION OF THE DRAWINGS

Referring now to the drawings, which form a part of the original disclosure:

FIGS. 5, 6 and 7 are rear, side and rear perspective views, respectively, of the conductive shielding strip that is used in the channel unit to reduce EMI emissions;

DETAILED DESCRIPTION OF THE PREFERRED EMBODIMENTS

Figure 1:
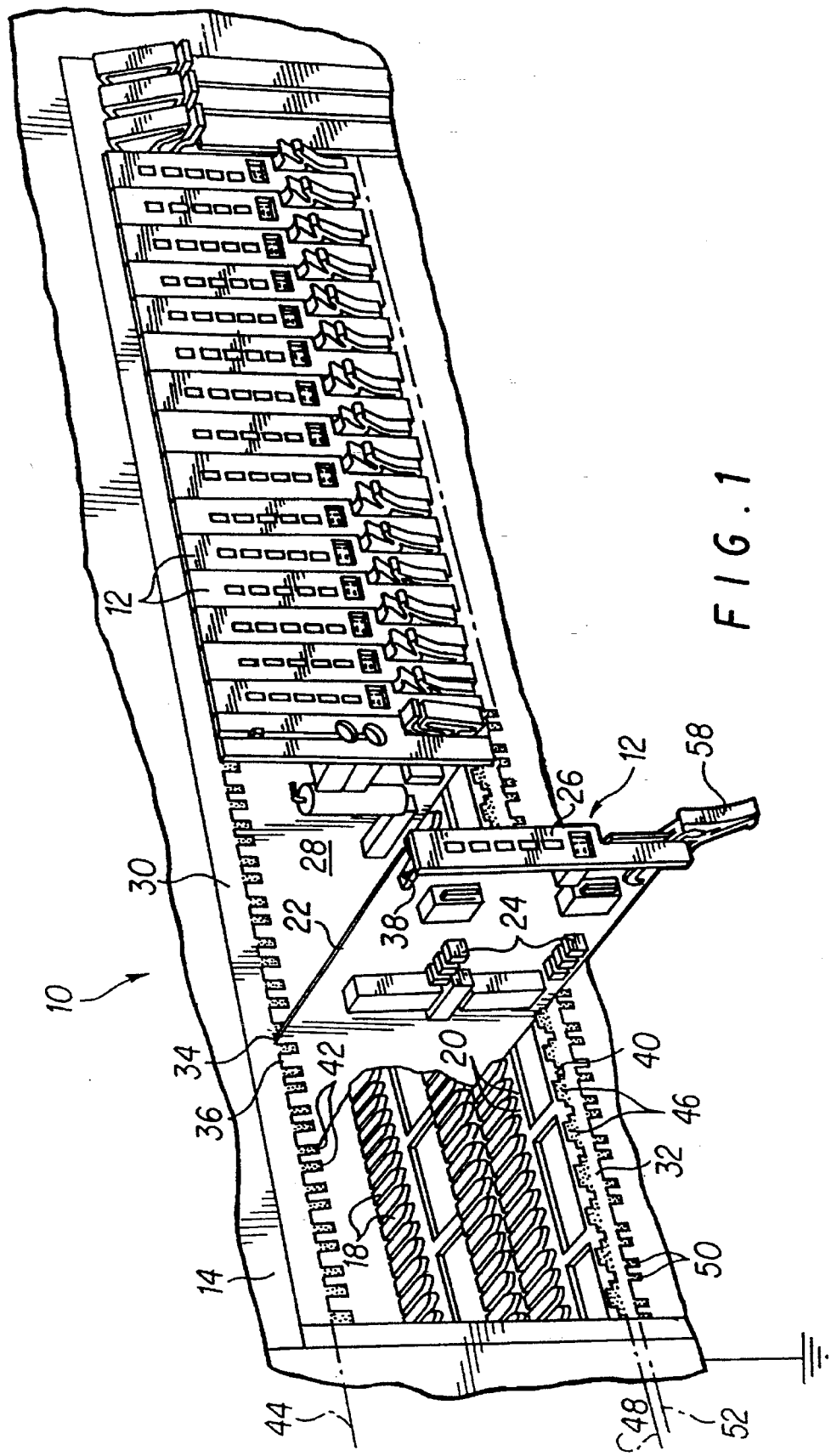
FIG. 1 is a perspective view of a telephone channel bank, with one channel unit shown partially inserted.

FIG. 1 illustrates a telephone channel bank 10 in which the present invention may be advantageously employed. The channel bank 10 comprises a horizontal row of pull-out circuit cards 12, referred to as channel units, which are held vertically in a side-by-side arrangement as shown. The channel units 12 are received in a grounded metal frame or housing 14, which is typically made of aluminum. Only the top portion of the housing 14 is shown in FIG. 1, it being understood that the housing 14 will ordinarily include additional rows of channel units 12 below the row shown. Internally, the housing 14 includes perforated metal shelves 16 located above and below each row of channel units 12, and the shelves 16 are formed with raised guides 18 which form slots or grooves 20 for receiving the channel units 12. Each channel unit 12 comprises a rectangular insulative circuit board 22 having various electronic components 24 on its left-hand vertical surface, and an insulative faceplate 26 connected to the circuit board 22 along the front edge thereof. When the channel unit 12 is fully inserted into the channel bank 10, the faceplate 26 lies vertically across the horizontal rectangular opening 28 in the housing 14.

Metal designator strips 30 and 32 are affixed by screws (not shown) to the forward surface of the housing 14 immediately above and below the opening 28. The purpose of the designator strips 30 and 32 is to carry legends or indicia (not shown) which indicate the proper placement of the channel units 12 in the channel bank 10. Certain types of circuit cards other than channel units, such as optical-electrical interface (OEI) cards and transmit-receive units (TRUs), are typically included in the channel bank 10, and the designator strips 30 and 32 also indicate the proper placement of these additional circuit cards. For each circuit card location, the upper designator strip 30 is formed with two adjacent notches 34 and 36. The smaller notch 34 serves as a guide to allow the circuit board 22 of the channel unit 12 to be inserted into the opening 28 in alignment with the corresponding grooves 20 defined between the internal guides 18. The larger notch 36 is a keyway notch which receives a corresponding key 38 formed on the upper part of the channel unit faceplate 26. The key 38 aligns with the notch 36 only when the circuit card is of the proper type for the card location in question, thereby preventing the wrong type of circuit card from being inserted at that location. The lower designator strip 32 is formed with notches 40 which all have the same configuration. The narrow bottom portions of the notches 40 serve to guide the lower edge of the circuit board 22 into the grooves 20 between the frame guides 18, and the wider upper portions of the notches 40 provide clearance for the electrical components 24 located near the lower edge of the circuit board 22.

As will be described in more detail hereinafter, the designator strips 30 and 32 are used to establish electrical connections between a conductive shielding strip located behind the faceplate 26 of each channel unit 12 and the grounded, conductive frame or housing 14 of the channel bank 10. To this end, portions of each designator strip 30 and 32 are left bare or unpainted to provide electrical contact surfaces. In the case of the upper designator strip 30, the stippled regions 42 below the line 44 are left unpainted, and in the case of the lower designator strip 40, the stippled areas 46 above the line 48 and the stippled areas 50 below the line 52 are left unpainted. The remaining areas of the designator strips 30 and 32 are painted and contain printed legends indicating the proper placement of the channel units 12 and other circuit cards as described previously. The designator strips 30 and 32 are affixed to the conductive frame or housing 14 by means of metal screws, thereby establishing electrical continuity between the unpainted electrical contact areas 42, 46, 50 and the metal frame 14. It will be noted that the lower designator strip 32 includes a lower set of notches similar to the notches 34 and 36 in the upper designator strip 30. This lower set of notches corresponds to the opening for the next lower row of channel units in the channel bank 10, which is not shown in FIG. 1.

Figure 2:
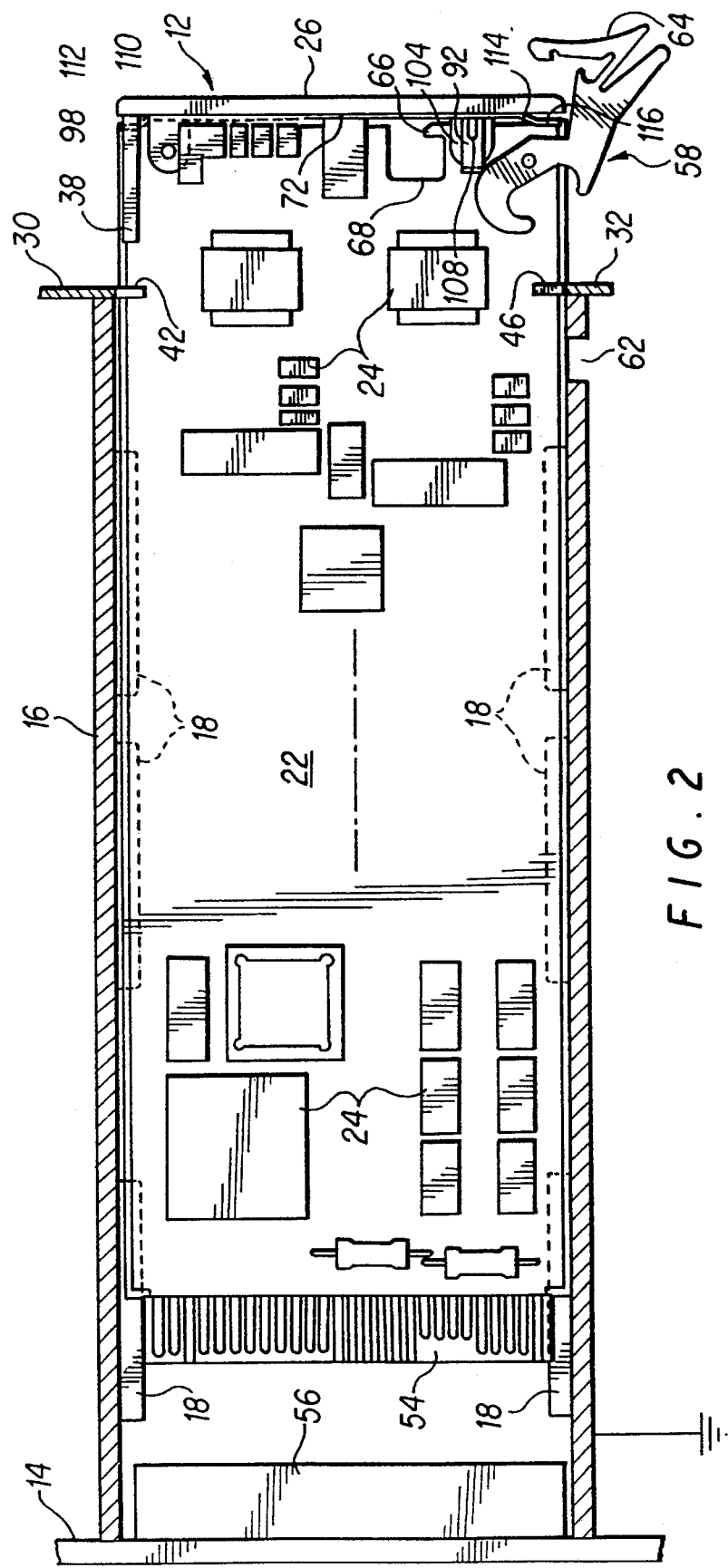
FIG. 2 is a side sectional view of the channel bank, with one channel unit shown partially inserted.
Figure 3:
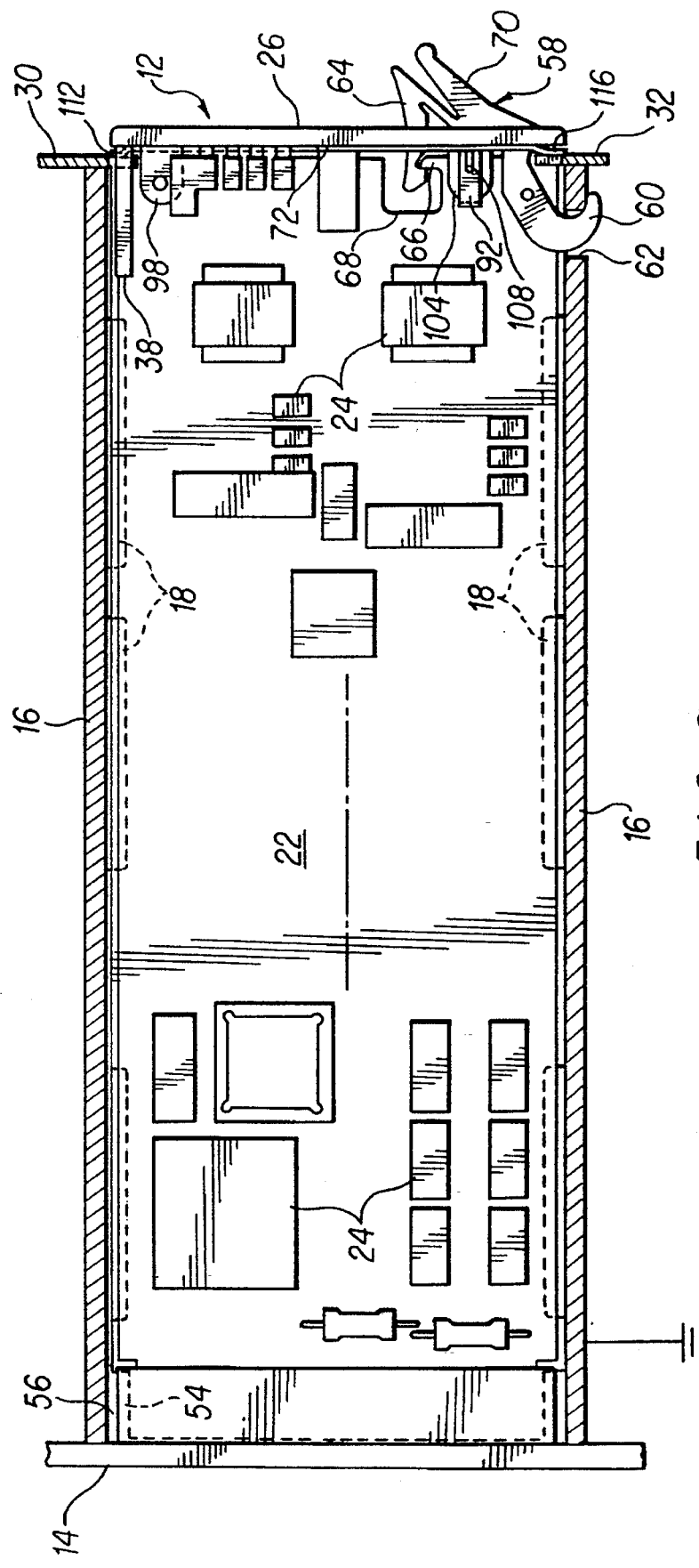
FIG. 3 is a side sectional view of the channel bank similar to FIG. 2, but with the channel unit shown fully inserted.

FIGS. 2 and 3 are side sectional view illustrating the manner in which one of the channel units 12 is inserted into the housing 14. In FIG. 2, the channel unit 12 is shown partially inserted. The upper and lower edges of the circuit board 22 are received in the grooves formed between the rows of upper and lower guides 18, but the edge strip or plug 54 at the rear edge of the circuit board 22 is not yet received in the edge connector 56 at the rear of the frame or housing 14. In FIG. 3, the channel unit has been moved farther to the left, and is now fully inserted into the housing 14. In this position, the edge plug 54 is fully inserted into the edge connector 56, thereby establishing electrical connections between the channel unit 12 and other equipment contained in the channel bank 10 of FIG. 1. A pivotable plastic latch 58 is used to retain the channel unit 12 in the fully inserted position. When the latch 58 is rotated to its fully counter-clockwise position, as shown in FIG. 3, a locking hook 60 extends through an opening 62 in the lower shelf 16 of the frame or housing 14 to hold the channel unit in position, and a pawl arm 64 engages a projecting tooth 66 formed in a cut-out portion 68 of the circuit board 22 to hold the latch 58 in position. The latch 58 can be returned to the position shown in FIG. 2 by squeezing the pawl arm 64 and handle portion 70 together to disengage the pawl arm 64 from the tooth 66, and then rotating the latch 58 in a clockwise direction to disengage the locking hook 60 from the opening 62. The channel unit 12 can then be removed from the frame or housing 14 by sliding the entire channel unit 12 in the right-hand direction while gripping the latch 58.

Figure 4:
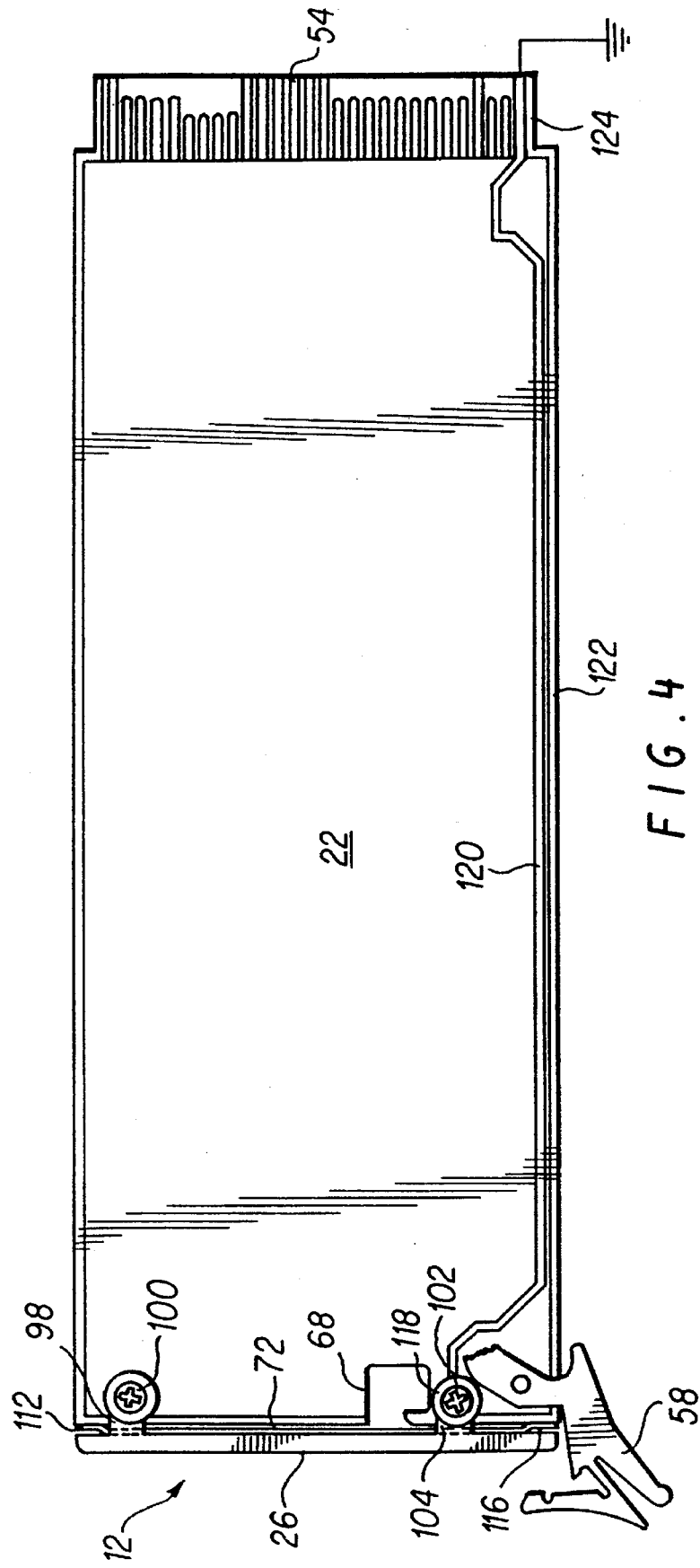
FIG. 4 is a back view of the channel unit, shown removed from the channel bank.
Figure 8:
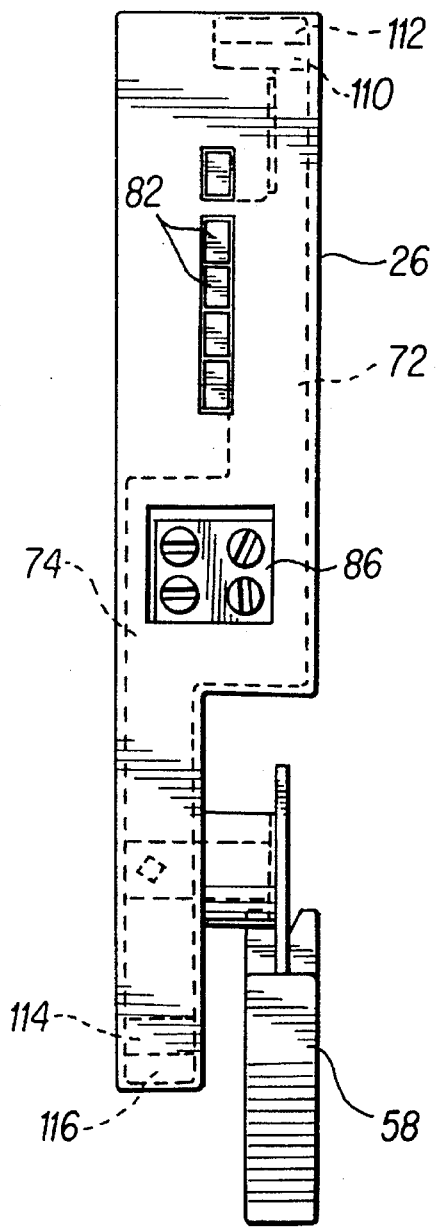
FIG. 8 is a front view of the channel unit faceplate, illustrating in dashed lines the profile of the conductive shielding strip located behind the faceplate.

In accordance with an important feature of the present invention, EMI emission from the channel unit 12 is reduced by providing the channel unit 12 with an electrically conductive shielding strip 72 which extends generally vertically along the rear surface of the faceplate 26. The configuration of the shielding strip 72 is illustrated in detail in FIGS. 5-7, and the area occupied by the shielding strip 72 behind the faceplate 26 is illustrated in FIG. 8. Referring first to FIGS. 5-7, the shielding strip 72 comprises an intermediate portion 74 which is generally planar, and which is adapted to lie substantially flat along the planar rear surface of the faceplate 26. The intermediate portion 74 extends between the lines 76 and 78 in FIG. 7. This portion includes a number of notches and cut-outs which provide clearance for various components of the channel unit 12. For example, the notched area 80 provides clearance for the light-emitting diodes (LEDs) 82 shown in FIG. 8, and the square aperture 84 accommodates the test jack 86 of FIG. 8. Similarly, the notched area 88 provides clearance for the rotation of the latch 58 in FIG. 8. Attachment of the shielding strip 72 to the channel unit 12 is facilitated by means of two integrally formed tabs 90 and 92 which are bent outwardly from the plane of the intermediate portion 74. The upper tab 90 is bent at 90° from the plane of the intermediate portion 74, and is provided with a hole 94. The lower tab 92 consists of three sections bent at 90° with respect to each other to form a "U", with the last section containing a hole 96. With reference to FIG. 4, which illustrates the back side of the channel unit 12, and to FIGS. 2 and 3, the faceplate 26 will be seen to include a rearwardly projecting boss 98 for accommodating a metal screw 100. The screw 100 passes through the circuit board 22, hole 94 of tab 90, and boss 98, thereby locking the tab 90 between the circuit board 22 and the boss 98. In a similar manner, a second screw 102 passes through the circuit board 22 and hole 96 of tab 92, and is received in a hole formed in a second boss 104 extending rearwardly from the rear surface of the faceplate 26 at a point below the upper boss 98. Thus, the end of the lower tab 92 of the shielding strip 72 is locked in place between the circuit board 22 and lower boss 104 of the faceplate 26. In order to maintain the shielding strip 72 in position along the rear surface of the faceplate 26 during assembly, the shielding strip 72 is provided with a square hole 106 at a location adjacent to the lower tab 92. The square hole 106 is press-fitted around a small cylindrical pin 108 extending rearwardly from the rear surface of the faceplate 26, in order to join the shielding strip 72 to the rear surface of the faceplate 26.

With continued reference to FIGS. 5-7, the intermediate portion 74 of the conductive shielding strip 72 carries at its upper end an upper spring arm 110 and an upper contact pad 112. Similarly, the intermediate portion 74 of the conductive shielding strip 72 carries at its lower end a lower spring arm 114 and a lower contact pad 116. The upper and lower spring arms 110 and 114 each extend rearwardly from the intermediate portion 74 of the shielding strip 72 at an angle relative to the plane of the intermediate portion 72. This angle is preferably (but not necessarily) the same for both of the spring arms 110 and 114. The upper and lower contact pads 112 and 116 form planar electrical contact areas which are, in the illustrated embodiment, oriented vertically and parallel both to the rear surface of the faceplate 26 and to the plane of the intermediate portion 74 of the shielding strip 72. The upper and lower contact pads 112 and 116 are adapted to be brought into contact with the planar, vertically oriented upper and lower unpainted areas 42 and 46, respectively, of the designator strips 30 and 32 in FIG. 1 when the channel unit 12 is inserted into the frame or housing 14. In this way, a continuous, electrically conductive shunt is formed vertically across the opening 28 in FIG. 1, thereby reducing EMI emission from the interior of the channel bank 10.

The advantages of the spring arms 110, 114 and planar contact pads 112, 116 will be apparent from FIGS. 2 and 3. From FIG. 2, it will be observed that the planar electrical contact areas of the contact pads 112 and 116 lie parallel to the corresponding unpainted areas 42 and 46 of the designator strips 30 and 32 before the channel unit 12 is fully inserted. As a result, it is not necessary to flatten the spring arms 110 and 114 in order to obtain a large contact area between the upper and lower ends of the shielding strip 72 and the unpainted areas 42 and 46 of the designator strips 30 and 32, as was the case with the spring contacts of the prior art. This can be seen in FIG. 3, in which full contact is established between the planar contact pads 112, 116 and the unpainted areas 42, 46 of the designator strips 30, 32 without substantial deflection of the spring arms 110 and 114. Only a slight deflection of the spring arms 110 and 114 is necessary to maintain sufficient contact. This slight deflection reduces the possibility that the spring arms 110 and 114 will become permanently deformed through repeated bending. In addition, it will be apparent that the area of contact between each of the planar contact pads 112, 116 and the corresponding unpainted area 42 or 46 of the designator strip 30 or 32 will be approximately the same regardless of how far the channel unit 12 is inserted after initial contact is made. In this way, a predictable, low impedance connection can be established between the conductive shielding strip 72 and the frame or housing 14, without requiring precise manufacturing tolerances for the components of the channel unit 12 and channel bank 10.

It will also be appreciated that the planar contact area between the upper and lower contact pads 112, 114 and the corresponding unpainted areas 42, 46 of the designator strips 30, 32 allows for the possibility of capacitive coupling between the conductive shielding strip 72 and the frame 14 or housing of the channel bank 10. Thus, in the event that dirt or other contaminants accumulate between the upper and lower contact pads 112, 116 and the unpainted areas 42, 46 of the designator strips, the shunting effect of the shielding strip 72 will continue to be effective to some degree even if direct electrical conduction between these surfaces is reduced or eliminated. The degree of capacitive coupling between the upper and lower contact pads 112, 116 and the unpainted areas 42, 46 will be a function of the area of the contact pads 112, 116, their effective separation distance (if any) from the unpainted areas 42, 46, and the dielectric properties of the dirt or contaminants causing the separation. AC impedance is, of course, inversely proportional to both frequency and capacitance. The presence of dirt and contaminants is only one example of a situation in which capacitive coupling may be advantageous. Other examples include build-ups of manufacturing and/or assembly tolerances which result in a failure of either or both of the contact pads 112, 114 to touch the corresponding unpainted area 42, 46 and 50, and paint oversprays on the designator strips 30 and 32 which create gaps between the contact pads 112, 116 and the unpainted areas 42, 46 and 50. In both of these instances, capacitive coupling at high frequencies allows the conductive strip 72 to remain at least partially effective as an EMI emission shield.

In order to increase the effectiveness of the conductive shielding strip 72 in reducing EMI emissions, and to assist in draining off static charges from the channel unit 12 as it is being installed, the shielding strip 72 may also be connected to a ground terminal through a printed ground wire on the circuit board 22 itself. This is illustrated in FIG. 4. The metal screw 102 establishes a conductive connection between the lower tab 92 of the conductive shielding strip 72 and a metallic ring 118 formed on the circuit board 22. The metallic ring 118 is connected to a printed ground wire 120 which runs along the lower edge 122 of the circuit board 22 and terminates in a printed ground contact pad 124 on the edge plug 54. When the edge plug 54 is inserted into the edge connector 56 of FIGS. 2 and 3, a firm ground connection is established between the printed ground wire 120 and the frame 14 of the channel bank 10 via the contact pad 124 and edge connector 56. This assures that the conductive shielding strip 72 will be reliably connected to ground whenever the channel unit 12 is fully inserted, even in instances where the upper or lower contact pad 112 or 116 may be inoperative for some reason. If desired, a printed ground wire can be provided between the upper tab 90 of the conductive shielding strip 72 (via the upper metal screw 100) and the edge plug 54, and this ground wire can be in addition to, or in lieu of, the printed ground wire 120.

In a preferred embodiment of the invention, the conductive shielding strip 72 is made from a single strip of metal and horizontal fold lines 126, 128 and 130, 132 are used to define the spring arms 110, 114 and contact pads 112, 116 as shown. Various metals may be used, although 0.005-inch thick stainless steel (301 alloy, ½ hard) is preferred since it resists corrosion, provides good resiliency for the spring arms 110 and 114, and is a good conductor of electrical current. However, other metals such as phosphor bronze and beryllium copper can also be used. The conductive shielding strip 72 need not be made entirely of metal, but may instead consist of a non-metallic material with an outer metallic layer or coating. The conductive shielding strip 72 may also be integrated with the rear surface of the plastic faceplate 26 if desired, by forming the rear surface of the faceplate in the desired shape and then applying a metallic layer or coating.

Figure 9:
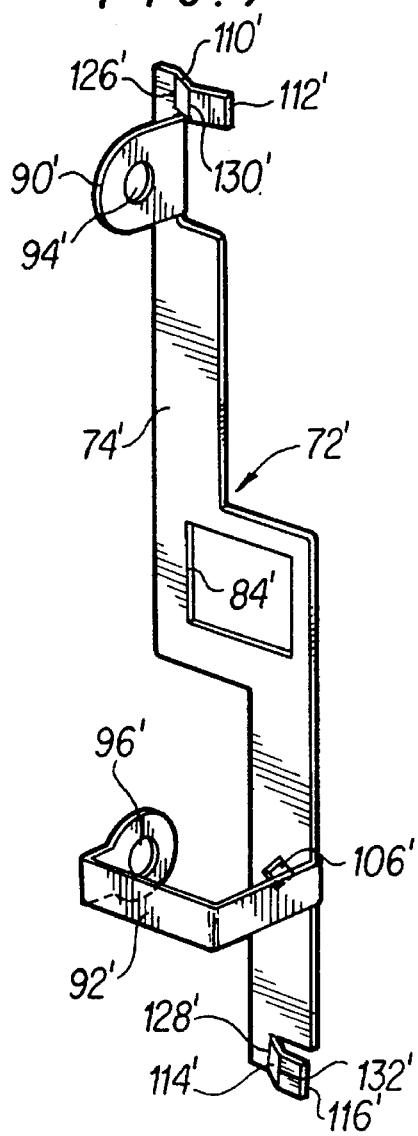
FIG. 9 is a perspective view of a modified conductive shielding strip which may be employed in the present invention.

FIG. 9 discloses a modified embodiment of a conductive shielding strip 72' which may be employed in the present invention. In the modified embodiment, the intermediate portion 74' extends the entire vertical length of the conductive shielding strip 72', and the spring arms 110', 114' and contact pads 112', 116' extend horizontally rather than vertically. This is achieved by forming the spring arms 110', 114' and contact pads 112', 116' using vertical fold lines 126', 128' and 130', 132' as shown, rather than using horizontal fold lines as in the previous embodiment. The modified embodiment of FIG. 9 may be advantageous in some instances, as for example where it is necessary for the horizontally extending spring arms 110, 114, and contact pads 112', 116' to clear obstructions on the circuit board 22 or on the rear surface of the faceplate 26 that could not be easily avoided using vertically extending spring arms and contact pads. In both embodiments, it is preferred that the angles between the spring arms and the contact pads, and the angles between the spring arms and the plane of the intermediate portion of the shielding strip, be made oblique (i.e., either more or less than 90°), so that the deflection of the spring arms will occur in a predictable direction.

In order to enhance electrical conduction between the contact pads 112, 116 and 112', 116' in the embodiments of FIGS. 7 and 9, respectively, the unpainted areas 42, 46 and 50 of the designator strips 30 and 32 in FIG. 1 may be coated with an oxidation-inhibiting material such as Iridite®. This material is available from Wito Corporation of New York, N.Y. From a manufacturing standpoint, it may be convenient to apply a coating of Iridite® to the entire outside surfaces of the designator strips 30 and 32, and then to mask the areas 42, 46 and 50 during the subsequent painting and lettering steps.

The planar contact areas of the contact pads 112, 116 and 112', 116' in the embodiments of FIGS. 7 and 9 are preferably smooth and flat in order to provide maximum contact area with the smooth, flat unpainted areas 42, 46 and 50 of the designator strips 30 and 32. If desired, however, surface texturing may be provided on the planar contact areas of the contact pads 112, 116 and 112', 116', and/or on the unpainted areas 42, 46 and 50 of the designator strips 30 and 32.

While only two exemplary embodiments have been chosen to illustrate the present invention, it will be understood by those skilled in the art that various changes and modifications can be made therein without departing from the spirit and scope of the invention as defined in the appended claims.

What is claimed is:

1. An electrical assembly characterized by reduced emission of electromagnetic interference, comprising:

a grounded, electrically conductive housing for receiving a plurality of removable circuit cards, said housing defining a horizontally extending front opening for receiving said circuit cards vertically in a side-by-side manner, said housing having upper and lower electrical contact surfaces immediately above and below said front opening, respectively; and an electrical circuit card removably received in said housing, said circuit card comprising:

an insulative circuit board having front, rear and side edges and having electrical circuitry thereon;

an insulative faceplate coupled to said circuit board along the front edge thereof and adapted to lie generally vertically across said front opening of said housing when said circuit card is received in said housing, said faceplate having a rear surface facing said circuit board; and an electrically conductive strip carried by at least one of said circuit board and said faceplate, said electrically conductive strip comprising an intermediate portion extending generally vertically along the rear surface of said faceplate, resilient upper and lower spring arms each extending rearwardly from said intermediate portion at an angle relative to said intermediate portion, and upper and lower contact pads at the ends of said respective upper and lower spring arms, said upper and lower contact pads forming planar contact areas which are each disposed at an angle relative to said respective upper and lower spring arms and are oriented parallel to the respective upper and lower electrical contact surfaces of said housing, said upper and lower contact pads being adapted to be brought into contact with said respective upper and lower contact surfaces of said housing when said circuit card is received in said housing.

2. An electrical assembly as claimed in claim 1, wherein said intermediate portion, said upper and lower spring arms, and said upper and lower contact pads of said electrically conductive strip are formed integrally from a single strip of metal.

3. An electrical assembly as claimed in claim 2, wherein said upper and lower spring arms and said upper and lower contact pads are defined by folds in said strip of metal.

4. An electrical assembly as claimed in claim 3, wherein said upper and lower spring arms and said upper and lower contact pads are defined by horizontal folds.

5. An electrical assembly as claimed in claim 3, wherein said upper and lower spring arms and said upper and lower contact pads are defined by vertical folds.

6. An electrical circuit card adapted to be removably received in a grounded, electrically conductive housing with reduced emission of electromagnetic interference, comprising:

an insulative circuit board having front, rear and side edges and having electrical circuitry thereon;

an insulative faceplate coupled to said circuit board along the front edge thereof, said faceplate having a rear surface facing said circuit board; and an electrically conductive strip carried by at least one of said circuit board and said faceplate, said electrically conductive strip comprising an intermediate portion extending generally vertically along the rear surface of said faceplate, resilient upper and lower spring arms each extending rearwardly from said intermediate portion at an angle relative to said intermediate portion, and upper and lower contact pads at the ends of said respective upper and lower spring arms, said upper and lower contact pads forming planar contact areas which are each disposed at an angle relative to said respective upper and lower spring arms.

7. An electrical circuit card as claimed in claim 6, wherein said planar contact areas are oriented vertically and parallel to the rear surface of said faceplate and to said intermediate portion of said contact strip.

8. An electrical circuit card as claimed in claim 6, wherein said intermediate portion, said upper and lower spring arms, and said upper and lower contact pads of said conductive shielding strip are formed integrally from a single strip of metal.

9. An electrical circuit card as claimed in claim 8, wherein said upper and lower spring arms and said upper and lower contact pads are defined by folds in said strip of metal.

10. An electrical circuit card as claimed in claim 9, wherein said upper and lower spring arms and said upper and lower contact pads are defined by horizontal folds.

11. An electrical circuit card as claimed in claim 9, wherein said upper and lower spring arms and said upper and lower contact pads are defined by vertical folds.

12. An electrically conductive shielding strip for reducing the emission of electromagnetic interference from a circuit card adapted to be removably received in a grounded, electrically conductive housing, said circuit card being of the type comprising an insulative circuit board and an insulative faceplate coupled to said circuit board along one edge thereof such that a rear surface of said faceplate faces said circuit board, said shielding strip comprising:

an intermediate portion adapted to extend generally vertically along the rear surface of said faceplate;

resilient upper and lower spring arms each extending rearwardly from said intermediate portion at an angle relative to said intermediate portion; and upper and lower contact pads at the ends of said respective upper and lower spring arms, said upper and lower contact pads forming planar contact areas which are each disposed at an angle relative to said respective upper and lower spring arms.

13. An electrically conductive shielding strip as claimed in claim 12, wherein said planar contact areas are oriented vertically and parallel to said intermediate portion.

14. An electrically conductive shielding strip as claimed in claim 12, wherein said intermediate portion, said upper and lower spring arms, and said upper and lower contact pads of said conductive shielding strip are formed integrally from a single strip of metal.

15. An electrically conductive shielding strip as claimed in claim 14, wherein said upper and lower spring arms and said upper and-lower contact pads are defined by folds in said strip of metal.

16. An electrically conductive shielding strip as claimed in claim 15, wherein said upper and lower spring arms and said upper and lower contact pads are defined by horizontal folds.

17. An electrically conductive shielding strip as claimed in claim 15, wherein said upper and lower spring arms and said upper and lower contact pads are defined by vertical folds.

18. A method for reducing the emission of electromagnetic interference from an electrical circuit card which is adapted to be removably received in a grounded, electrically conductive housing affording an electrical contact surface adjacent to said circuit card, said circuit card being of the type comprising an insulative circuit board and an insulative faceplate coupled to said circuit board along one edge thereof such that a rear surface of said faceplate faces said circuit board, said method comprising the steps of:

providing said circuit card with a shielding strip extending generally vertically along the rear surface of said faceplate;

providing said shielding strip with at least one planar electrical contact area spaced rearwardly from the rear surface of said faceplate, said planar electrical contact area being oriented in alignment with and parallel to said electrical contact surface of said housing during insertion of said circuit card into said housing and prior to contact with said electrical contact surface of said housing, said planar electrical contact area of said shielding strip being resiliently displaceable toward and away from said rear surface of said faceplate; and inserting said circuit card into said housing by a distance sufficient to bring said planar electrical contact area of said shielding strip into contact with said electrical contact area of said housing and to resiliently displace said planar electrical contact surface of said shielding strip in the direction toward the rear surface of said faceplate.

19. A method as claimed in claim 18, wherein said shielding strip is resiliently deflectable, and wherein said resilient displacement of said contact area results from resilient deflection of said shielding strip.

20. A method as claimed in claim 19, wherein said housing affords a second electrical contact surface adjacent to said circuit card, and further comprising the steps of:

providing said shielding strip with a second planar electrical contact area spaced vertically from said first planar electrical contact area, said second planar electrical contact area being spaced rearwardly from the rear surface of said faceplate and being resiliently displaceable toward and away from said rear surface, said second planar electrical contact area being oriented in alignment with and parallel to said second electrical contact surface of said housing during insertion of said circuit card into said housing and prior to contact with said second electrical contact surface of said housing; and during insertion of said circuit card into said housing, bringing said second planar electrical contact area of said shielding strip into contact with said second electrical contact surface of said housing and resiliently displacing said second planar electrical contract area of said shielding strip in the direction toward the rear surface of said faceplate.

\* \* \* \* \*